(12) United States Patent
Suzuki

(10) Patent No.: US 6,573,515 B1
(45) Date of Patent: Jun. 3, 2003

(54) CHARGED-PARTICLE-BEAM PROJECTION-EXPOSURE APPARATUS AND METHODS EXHIBITING IMPROVED ALIGNMENT AND REGISTRATION OF PROJECTED PATTERN PORTIONS

(75) Inventor: Kazuaki Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/419,829

(22) Filed: Oct. 14, 1999

(30) Foreign Application Priority Data

Oct. 14, 1998 (JP) .......................................... 10-306394

(51) Int. Cl.⁷ .......................... G21G 5/00; G21K 5/10; H01J 37/08
(52) U.S. Cl. .............................. 250/492.2; 250/492.22; 250/492.3; 430/5; 430/30; 430/296
(58) Field of Search .................... 250/492.2, 492.22, 250/492.3; 430/5, 30, 296

(56) References Cited

U.S. PATENT DOCUMENTS

| | | | | |
|---|---|---|---|---|
| 4,504,558 A | * | 3/1985 | Bohlen et al. ............ | 250/492.2 |
| 4,840,874 A | * | 6/1989 | Shigemitsu et al. ........ | 430/296 |
| 4,924,257 A | * | 5/1990 | Jain ........................ | 250/492.2 |
| 6,153,340 A | * | 11/2000 | Nakasuji ..................... | 430/296 |
| 6,177,218 B1 | * | 1/2001 | Felker et al. ................. | 430/30 |
| 6,204,509 B1 | * | 3/2001 | Yahiro et al. ............ | 250/491.1 |

* cited by examiner

*Primary Examiner*—Jack Berman
*Assistant Examiner*—Kalimah Fernandez
(74) *Attorney, Agent, or Firm*—Klarquist Sparkman LLP

(57) ABSTRACT

Charged-particle-beam projection-exposure apparatus and methods are disclosed that achieve improved pattern-transfer accuracy, especially when using a segmented stencil reticle. To such end, the pattern field of a reticle pattern is divided into multiple exposure units that are individually and sequentially exposed onto corresponding regions on a substrate (e.g., semiconductor wafer). Any exposure units defining a feature surrounding an island region are split into complementary exposure units. Boundaries between adjacent exposure units are placed so as not to cross features or feature portions in the respective exposure units, defined by "white" regions of the reticle. Thus, when images of the exposure units are stitched together on the wafer, improved feature registration, alignment, and linewidth control are achieved.

11 Claims, 6 Drawing Sheets

CHARGED-PARTICLE-BEAM PROJECTION-EXPOSURE APPARATUS AND METHODS EXHIBITING IMPROVED ALIGNMENT AND REGISTRATION OF PROJECTED PATTERN PORTIONS

FIELD OF THE INVENTION

This invention pertains to microlithography apparatus and methods as used, for example, in the manufacture of semiconductor integrated circuits and displays. More specifically, the invention pertains to such apparatus and methods that employ a charged particle beam (e.g., electron beam or ion beam) as an energy beam for performing projection-transfer of a pattern, defined by a segmented reticle, onto a sensitive substrate such as a semiconductor wafer. Yet more specifically, the invention pertains to such apparatus and methods exhibiting greater pattern-transfer accuracy whenever a segmented stencil reticle is used.

BACKGROUND OF THE INVENTION

The known prior art is summarized below in the context of electron-beam microlithographic systems as representative charged-particle-beam (CPB) microlithographic systems. Whereas electron-beam microlithography potentially is more accurate for performing pattern transfer than optical microlithography (including optical microlithography performed using ultraviolet light), conventional experience with electron-beam microlithography has been plagued by, among various problems, low "throughput" (number of wafers that can be exposed per unit time).

Various approaches have been investigated to increase throughput. One approach is "cell projection" which is conventionally used whenever the pattern comprises a small basic unit portion (measuring, e.g., (5 $\mu$m)$^2$ on the wafer) that is repeated a large number of times in the pattern, such as a pattern for a memory chip in which the unit portion is a single memory cell. An image of the single unit portion is transferred to the wafer per exposure dose ("shot"); hence, many shots are required to transfer all the unit portions in the pattern. The same unit portion can be defined in multiple regions on the reticle. Unfortunately, circuit patterns such as memory chips include portions that are not repeated, and transfer of such portions requires application of another technique such as "variable-shaped beam" lithographic writing. The need to use multiple techniques to achieve transfer of the entire pattern reduces throughput. In practice, the throughput achieved with cell projection is typically less than ten.

Another conventional approach (termed "full-field exposure"), in which a reticle defining an entire pattern is transferred in one shot to a corresponding die on the wafer, offers prospects of very high throughput. Unfortunately, however, the very large exposure field required necessitates using electron optics having a correspondingly extremely large field. Such large electron-optical systems are prohibitively costly and bulky. Also, in such large fields, the peripheral regions of the field as projected tend to exhibit large aberrations that have been impossible to date to adequately correct. Furthermore, a reticle for use with full-field exposure is extremely difficult to fabricate.

In response to the problems with the full-field exposure technique, the "divided-pattern projection-exposure" technique was proposed. In the divided-pattern technique, a reticle (mounted on a movable reticle stage) defines the entire pattern to be transferred to a corresponding die on the wafer (mounted on a movable wafer stage). Rather tan being exposed entirely in one shot, the pattern field as defined on the reticle is divided into multiple "exposure units" (e.g., "subfields") that are individually and sequentially illuminated. Illumination is performed by an "illumination beam" passing through an "illumination-optical system" located upstream of the reticle. An image of the illuminated exposure unit passes (as a "patterned beam") through a "projection-optical system" located between the reticle and the wafer. The projection-optical system has a field that is much smaller than the field of the entire pattern as defined on the reticle. The image that is projected by the projection-optical system onto a corresponding region of the wafer is "demagnified" or "reduced," by which is meant that the image is smaller (usually by an integer "demagnification ratio" such as 1/4 or 1/5) than the corresponding exposure unit on the reticle.

Systems that perform divided-pattern projection-exposure achieve lower throughput than the full-field exposure technique but substantially higher throughput than the cell projection technique. For details on divided-pattern projection-exposure, see, e.g., U.S. Pat. No. 5,260,151, incorporated herein by reference, and Japan Kokai Published Patent Document No. Hei 8-186070.

In divided-pattern projection-exposure, two basic types of reticles, termed "stencil" and "membrane" reticles, are currently used. Stencil reticles are usually configured as "scattering-stencil" reticles in which pattern features are defined by corresponding voids (openings) extending through the thickness dimension of a silicon membrane approximately 1 to 5 $\mu$m thick. Charged particles in an illumination beam incident on an exposure unit of such a reticle pass through the voids without being scattered or absorbed by the reticle. In contrast, charged particles of the illumination beam incident on the membrane itself also pass through the membrane, but are scattered during such passage. To prevent such scattered particles from reaching the wafer, a "contrast aperture" is situated in the projection-optical system at or near the conjugate plane of the entrance pupil of the projection-optical system (which is also the Fourier plane of the reticle surface). Particles that are not scattered pass through an axial aperture defined by the contrast aperture, whereas scattered particles are blocked (absorbed) by the contrast aperture and thus prevented from propagating to the wafer. Particles of the beam passing through the axial aperture are not further scattered and form an image of the illuminated exposure unit of the reticle on the wafer.

In a stencil reticle, the feature-defining voids are termed "white" regions and surrounding membrane regions are termed "black' regions. The white and black regions collectively define the pattern defined by the reticle. Certain features defined by a stencil reticle include so-called "island" regions that are defined by a black region surrounded by a white region. As readily can be surmised, an island (black) region cannot be situated within a surrounding white region in a stencil reticle because the island region would not have any physical support. Such a problem is referred to as the "stencil problem" or the "donut problem."

To solve the donut problem, the exposure unit containing an island region is divided into two "complementary" exposure units in which the white region surrounding the island black region is divided in a manner providing (in each complementary exposure unit) physical support for the island black region. Each complementary exposure unit is individually exposed onto the same region on the wafer. Such double exposure on the same region of the wafer ideally results in the corresponding two images being in accurate registration with each other to form the complete island region. Unfortunately, the need to perform two exposures on at least some of the exposure units of the reticle correspondingly decreases throughput.

Another solution to the donut problem encountered with stencil reticles is to use instead a "scattering-membrane reticle" that is not subject to the donut problem. In a scattering-membrane reticle, a patterned layer of a high-scattering material is layered on a membrane made of a low-scattering material. The high-scattering material (e.g., chrome or tungsten approximately 10 to 200 nm thick) causes a high degree of scattering to particles of an illumination beam incident on an exposure unit of the reticle, even though such particles are transmitted by the membrane. The low-scattering material is typically a thin silicon membrane (approximately 100 nm thick) that transmits particles of an incident illumination beam while imparting relatively little scattering to the transmitted particles. Whenever a scattering-membrane reticle is used, highly scattered transmitted particles are blocked by a contrast aperture configured and situated as described above. An image of the illuminated exposure unit of the reticle is formed on the wafer by the transmitted (but little scattered) particles transmitted by the silicon membrane. By using a scattering-membrane reticle, throughput is improved compared to when using a stencil reticle because island regions can be transferred with a single shot.

Even though a scattering-membrane reticle requires only single exposures of each exposure unit of the reticle to transfer the pattern to the wafer, as discussed above, the extreme thinness of the membrane imposes substantial problems in reticle fabrication. On the other hand, even though double exposures of complementary exposure units are required with a scattering-stencil reticle to solve the donut problem, most of the membrane itself is much thicker and thus much stronger than the membrane used in a scattering-membrane reticle. This greater strength is a substantial advantage.

A typical area of an exposure unit as projected onto the wafer is one to several hundred micrometers square. The size of one die (chip) on the substrate can be 20 mm×40 mm. To produce a complete die, the images of individual exposure units on the wafer are "stitched" together in a two-dimensional array by means of stage-position control and/or CPB deflection control.

To stitch together images of projected exposure units, the edges of adjacent images must be joined together at the "seams" between the images. In conventional experience with stitching together such images, the images are frequently distorted along their edges, or the images are rotationally or positionally misaligned due to errors in stage movements and/or beam deflection. Such phenomena arise regardless of which type of segmented reticle is used, and adversely affect stitching accuracy. As a result, feature linewidth accuracy in the projected pattern is less than desired. In addition, if a scattering-stencil reticle is used, an image formed by exposure of two complementary exposure units on the same location on the wafer is prone to misalignment or misregistration of different portions of the same feature with each other. Misalignment and/or misregistration within an individual feature is usually caused by an error in stage position or rotation and/or an error in beam deflection from the first exposure to the second, and usually results in loss of control of linewidth of the feature.

An example conventional manner in which portions of a feature are defined in complementary exposure units of a stencil reticle and exposed on a wafer is shown in FIGS. 5(a)–5(c). FIG. 5(a) represents the desired pattern portion 101 to be exposed. In the figure, the hatched areas 107 and shaded areas 109 are respective feature portions defined by "white" regions of a reticle and that receive, on the wafer, an exposure dose above the imprinting threshold of the "resist" layer on the wafer. The dashed lines 113 in the figure indicate boundaries between adjacent exposure units 111 on the reticle and denote the respective locations of seams between images of adjacent exposure units as projected on the wafer. In this example, the same feature patterns repeated in the four exposure units 111 shown. Inside each exposure unit 111 is an island region 110 defined by a corresponding black region on the reticle. Each island region is locally surrounded by a white region.

On a membrane reticle, even though each island region 110 is surrounded by a white region, an image of each exposure unit 111 can be formed on the wafer using only one respective exposure. No dividing of the exposure units 111 on the reticle into complementary exposure units is required. However, in the case of a stencil reticle, formation of an image of each exposure unit 111 requires exposure of each of two respective complementary exposure units 111a (FIG. 5(b) and 111b (FIG. 5(c)). Each exposure unit 111a defines a first portion 107 of the respective feature, and each exposure unit 111b defines a second portion 109 of the respective feature. Both portions 107, 109 are required to define the complete white region surrounding the island region 110. In FIG. 5(b), the exposure units 111a are defined on a first reticle 103, and in FIG. 5(c), the exposure units 111b are defined on a second reticle 105.

As can be seen in FIG. 5(a), feature lines cross the boundaries 113. For optimal pattern-transfer accuracy and resolution, formation of images of the exposure units 111a and 111b on the wafer requires accurate registration of each image of an exposure unit 111a with an image of a respective exposure unit 111b, and accurate alignment of images of adjacent exposure units with each other. Unfortunately, in conventional practice, adequate control of such parameters is elusive, resulting in imaging errors and loss of linewidth control, especially adjacent the seams 113.

SUMMARY OF THE INVENTION

This invention addresses certain of the problems of conventional apparatus and methods summarized above. Hence, an object of the invention is to provide charged-particle-beam (CPB) projection-exposure methods and apparatus exhibiting improved pattern-transfer accuracy, especially when performed using a segmented reticle.

According to a first aspect of the invention, methods are provided for performing CPB projection-exposure. General aspects of such a method include the steps of dividing a pattern, to be projection-exposed onto a sensitive substrate, into multiple exposure units each defining a respective portion of the pattern. The exposure units are sequentially illuminated using a charged-particle (CP) illumination beam to form a respective CP patterned beam. The patterned beam is projected onto a sensitive substrate to form images of the exposure units at respective locations on the substrate at which the images of the exposure units are stitched together to form an image of the pattern on the substrate. According to a representative embodiment, and with respect to any exposure unit defining a feature requiring two separate exposures to fully transfer the feature to the substrate, each of such exposure units is divided into first and second complementary exposure units each defining respective feature portions. Boundaries are defined around each first complementary exposure unit, and boundaries are defined around each second complementary exposure unit. The boundaries around the first complementary exposure units do not cross over the respective feature portions defined by the first complementary exposure units, and the boundaries around the second complementary exposure units do not cross over the respective feature portions defined by the second complementary exposure units. In other words, the boundaries around a first complementary exposure unit are laterally shifted relative to the boundaries around the corresponding second complementary exposure unit, with respect to the features defined by the particular pair of first and second complementary exposure units. As a result, the boundaries around the second complementary exposure unit are shifted relative to the boundaries around the corresponding first complementary exposure unit whenever the feature portions defined by the second complementary exposure unit are placed in registration with the feature portions defined by the corresponding first complementary exposure unit on the substrate. I.e., the first complementary exposure units and the second complementary exposure units are projection-exposed onto respective locations on the substrate such that, when projection-exposing a second complementary exposure unit on an image of a respective first complementary exposure unit, the boundaries around the second complementary exposure unit are shifted relative to the boundaries around the respective first complementary exposure unit.

The first and second complementary exposure units can be defined on the same reticle (e.g., in different respective regions of a single reticle) or on separate respective reticles.

According to another aspect of the invention, segmented reticles (e.g., stencil reticles) are provided for use in CPB microlithography. A representative embodiment of such a reticle comprises multiple exposure units each defining a respective portion of a pattern to be projection-exposed onto a sensitive substrate. At least one exposure unit defines a feature requiring two separate exposures to fully transfer the feature to the substrate. Such an exposure unit is divided into first and second complementary exposure units each defining respective feature portions. Each first complementary exposure unit is surrounded by respective boundaries, and each second complementary exposure unit is surrounded by respective boundaries. The boundaries around the first complementary exposure units do not cross over the respective feature portions defined by the first complementary exposure units, and the boundaries around the second complementary exposure units do not cross over the respective feature portions defined by the second complementary exposure units. This causes the boundaries around the second complementary exposure units to be shifted relative to the boundaries around the first complementary exposure units whenever the feature portions defined by the second complementary exposure unit are placed in registration with the feature portions defined by the respective first complementary exposure units.

According to another aspect of the invention, CPB microlithographic projection-exposure apparatus are provided. A representative embodiment of such an apparatus comprises a substrate stage on which a sensitive substrate is mounted for CPB projection-exposure of the substrate, and a reticle stage on which a reticle is mounted. The apparatus includes a reticle as generally summarized above. The apparatus also comprises an illumination-optical system situated upstream of the reticle stage. The illumination-optical system is configured to sequentially illuminate the exposure units of the reticle with a charged-particle (CP) illumination beam. The apparatus also includes a projection-optical system situated between the reticle stage and the substrate stage. The projection-optical system is configured to project, via a patterned beam propagating downstream of the reticle on the reticle stage, an image of the illuminated exposure unit onto a corresponding location on the sensitive substrate so as to stitch together the exposure-unit images and form an image of the pattern on the substrate.

Again, as noted above, the reticle can be a stencil reticle. The reticle can comprise a first reticle portion defining the first complementary exposure units and a second reticle portion defining the second complementary exposure units. Alternatively, the first and second reticle portions can be located on separate reticles. Whereas the invention is especially useful with stencil reticles, the invention also has utility when using membrane reticles such as scattering-membrane reticles.

Losses in accuracy of exposure linewidth control at seams of adjoining exposure units are avoided with this invention because feature portions in complementary exposure units are not formed at the boundaries of the respective complementary exposure units.

The foregoing and additional features and advantages of the invention will be more readily apparent from the following detailed description, which proceeds with reference to the accompanying drawings.

BRIEF DESCRIPTION OF THE DRAWINGS

FIGS. 1(*b*) and 1(*c*) depict respective complementary reticles (or reticle portions) used to produce the pattern of FIG. 1(*a*) on a wafer, showing the arrangement and configuration of feature portions on each respective reticle (or reticle portion). Boundaries between adjacent exposure units are shown.

FIGS. 2(*d*)–2(*e*) show the improved alignment of feature portions achieved according to the scheme shown in FIGS. 2(*a*)–2(*c*) compared to conventional practice, respectively.

DETAILED DESCRIPTION

Figure 3:
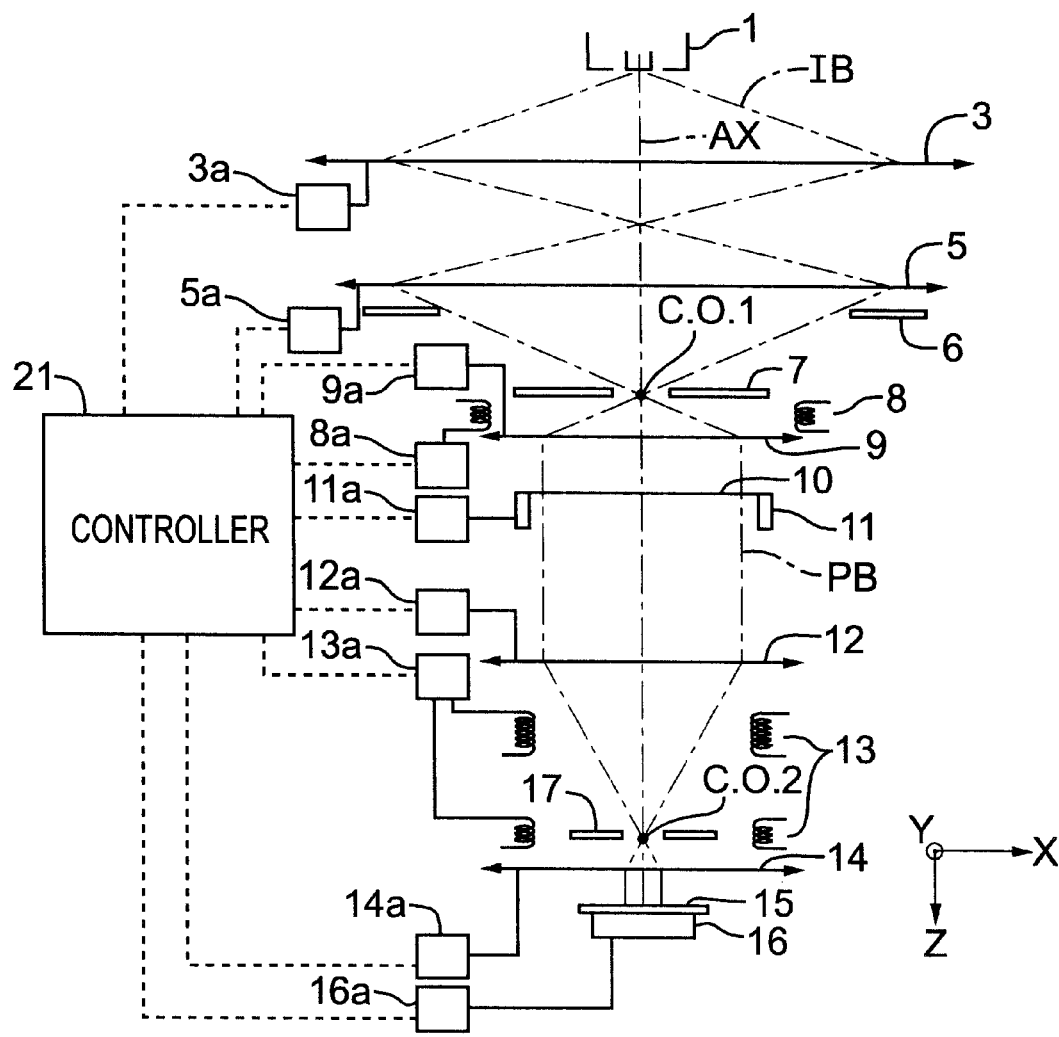
FIG. 3 is an elevational schematic diagram of key components in a charged-particle-beam (specifically electron-beam) microlithographic projection-exposure apparatus according to a representative embodiment of the invention. Components of the illumination-optical system and the projection-optical system are shown.

Various components and certain imaging relationships of a charged-particle-beam (CPB) microlithographic projection-exposure apparatus according to a representative embodiment of the invention are illustrated in FIG. 3. As a representative embodiment of a CPB projection-exposure apparatus, the apparatus of FIG. 3 utilizes an electron beam. FIG. 3 also schematically depicts a control system for controlling the overall optical system of the apparatus.

An electron gun 1 is situated at the most upstream end of the apparatus (top of FIG. 3). The electron gun emits an electron beam in a downstream direction along an optical axis AX (Z-direction). FIG. 3 also includes a reticle 10 and a substrate (termed herein a "wafer") 15. The beam propagating between the electron gun 1 and the reticle 10 is termed an "illumination beam" IB and the beam propagating between the reticle 10 and the wafer 15 is termed a "patterned beam" PB. From the electron gun 1, the illumination beam passes through a first condenser lens 3 and a second condenser lens 5 situated downstream of the electron gun 1. The condenser lenses 3, 5 cause the illumination beam IB to form a first crossover image C.O.1 on the optical axis AX downstream of the second condenser lens 5.

Downstream of the second condenser lens is a "beam-shaping aperture" 6 that defines an opening (typically rectangular or square in profile) that trims the illumination beam IB to have a transverse profile sized and profile to illuminate a single exposure unit e.g., subfield on the reticle 10. For example, the beam-shaping aperture 6 shapes the illumination beam IB to have a transverse square profile with dimensions of just over $(1 \text{ mm})^2$ on the reticle 10 so as to just illuminate one exposure unit on the reticle 10. An image of the beam-shaping aperture 6 is formed on the reticle 10 by a third condenser lens 9 situated between the first crossover C.O.1 and the reticle 10.

A blanking aperture 7 is axially disposed at the position of the first crossover C.O.1 downstream of the beam-shaping aperture 6. An illumination-beam deflector (IB deflector) 8 is also disposed downstream of the beam-shaping aperture 6. The IB deflector 8 sweeps the illumination beam IB in the X direction in FIG. 1, so as to illuminate each of multiple exposure units within the scanning range of the deflector 8 and within the field of the illumination-optical system. (The "illumination-optical system" comprises the components discussed above that are situated between the electron gun 1 and the reticle 10). The third condenser lens 9 collimates the illumination beam IB and forms an image of the beam-shaping aperture 6 on a region exposure unit on the reticle illuminated by the illumination beam IB.

Even though only one exposure unit (situated on the axis AX) is shown in FIG. 3, it will be understood that the reticle 10 actually extends within the X-Y plane perpendicular to the optical axis AX. The reticle 10 defines an entire pattern to be projection-exposed onto the wafer 15 at each of multiple dies (chips) on the wafer 15. As suggested above, the reticle is divided into multiple (typically thousands) of exposure units (also termed "subfields") that define respective portions of the overall pattern. The illumination beam is deflected by the IB deflector 8 as required to illuminate individual exposure units in a sequential manner within the field of the illumination-optical system.

The reticle is mounted on a reticle stage 11 that can be moved as required in the X- and Y-directions. The wafer (substrate) 15 is mounted on a wafer stage 16 that also can move as required in the X- and Y-directions. By synchronously moving the reticle stage 11 and wafer stage 16 scanningly in Y-directions that are opposite each other, exposure units linearly arrayed in the Y-direction on the reticle 10 are sequentially exposed onto corresponding regions on the wafer 15. The wafer 15 is also termed a "sensitive substrate" because the upstream-facing surface of the wafer is typically coated with a layer of a substance (termed a "resist") that is imprintable with the projected images.

Each of the stages 11, 16 is provided with a respective position-measurement system (not shown) employing laser interferometers. Thus, the positions of the respective stages 11, 16 can be determined and controlled extremely accurately. Such positional control of the stages 11, 16, along with other features of the FIG. 3 embodiment, allows the images of the exposure units on reticle 10 to be accurately "stitched" together on the wafer 15 as the images are exposed onto the wafer.

Situated between the reticle 10 and the wafer 15 is a "projection-optical system" comprising a first projection lens 12, a second projection lens 14, and at least one deflector 13. Whenever the illumination beam IB strikes an exposure unit on the reticle 10, particles of the beam pass through the illuminated exposure unit and become the "patterned beam" PB. The patterned beam PB is demagnified (also termed "reduced") by the projection lenses 12, 14 and deflected by the deflector 13 to form an image of the illuminated exposure unit at a desired location on the wafer 15.

A second crossover C.O.2 is formed at an axial location at which the distance between the reticle and the wafer 15 is subdivided by the "demagnification ratio" of the projection-optical system. (As used herein, the demagnification ratio is the integer ratio factor by which an image as formed on the wafer 15 is smaller than the corresponding exposure unit on the reticle 10.) A contrast aperture 17 blocks charged particles in the patterned beam PB that were scattered as the illumination beam IB passed through the reticle 10. Thus, such scattered particles do not reach the wafer 15.

The combination of the illumination-optical system and the projection-optical system is termed herein the "electron-optical system" (or more generally "CPB-optical system" if the beam is other than an electron beam).

The FIG. 3 embodiment also includes a controller 31 that is connected to each lens 3, 5, 9, 12, 14 via respective coil power supplies 3a, 5a, 9a, 12a, 14a, and to each deflector 8, 13 via respective coil power supplies 8a and 13a. The controller 31 is also connected to the reticle stage 11 and wafer stage 16 via respective stage drivers 11a, 16a. Thus, energization of each lens and deflector, and actuation of each stage, are directly controlled by the controller 31. Under such control, the various exposure units on the reticle 10 are sequentially illuminated by the illumination beam IB, and corresponding images of the exposure units are projected onto corresponding locations on the wafer 15. The exposure locations on the wafer are carefully determined so as to "stitch" together the demagnified images of the exposure units and hence achieve transfer of the entire reticle pattern to a die on the wafer.

Figure 4:
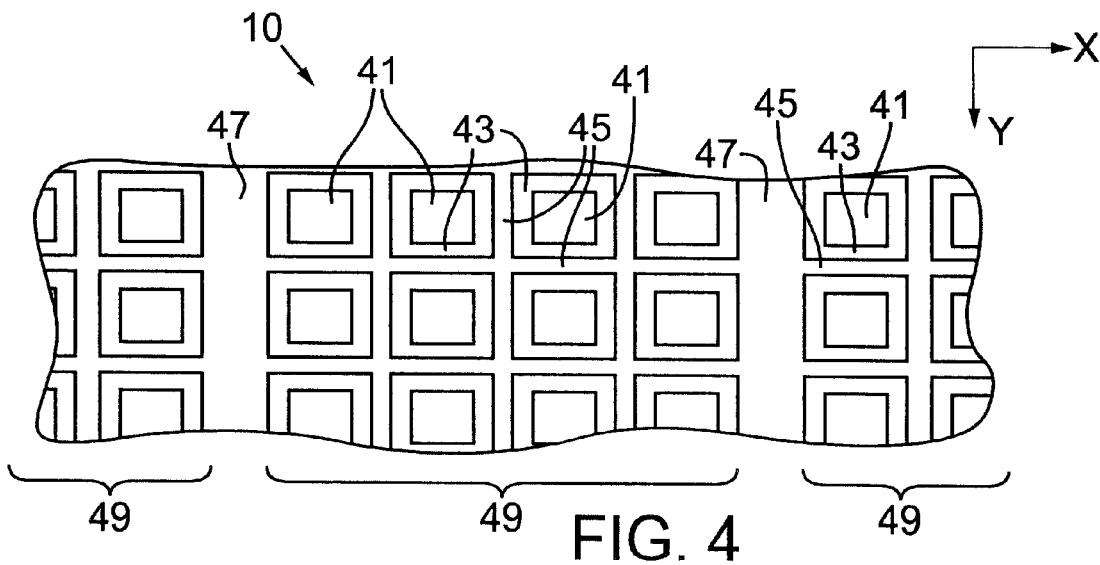
FIG. 4 is a plan view schematically depicting various structural aspects of a representative segmented reticle as used with the FIG. 1 embodiment.
Figure 5A:
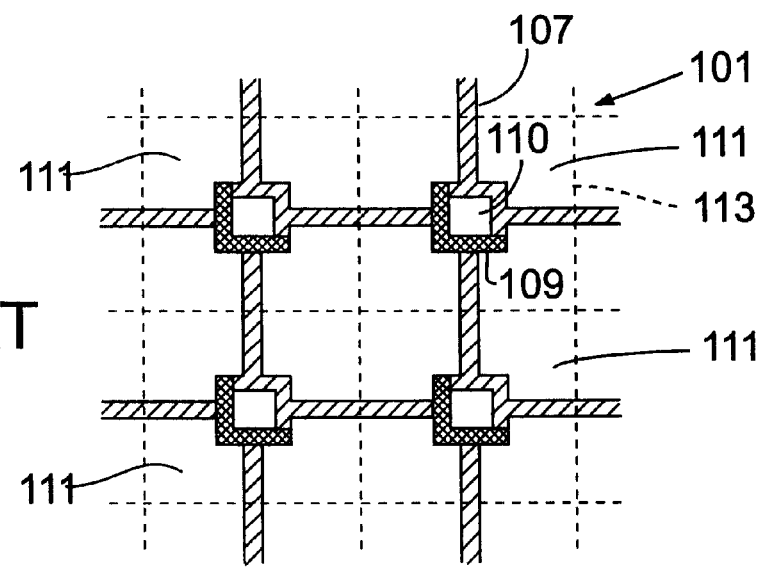
FIGS. 5(*a*)–5(*c*) are schematic plan views showing a division of features, surrounding respective island regions, according to conventional practice, among complementary reticles.
Figure 5B:
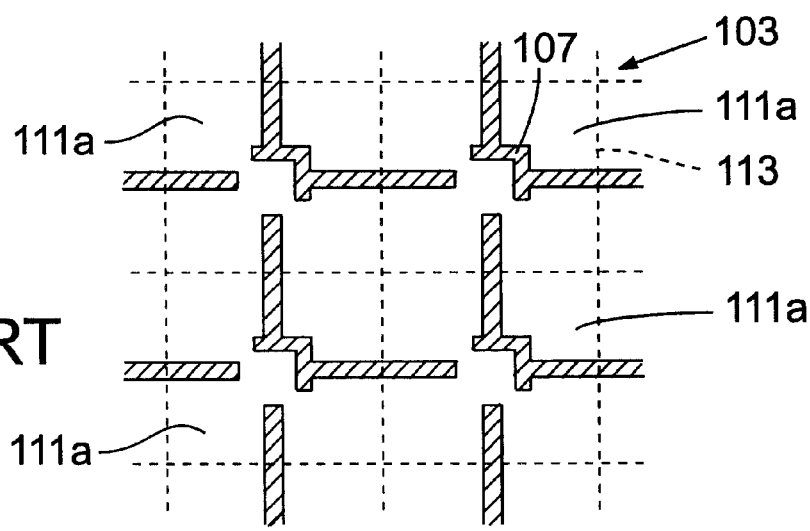
Figure 5C:
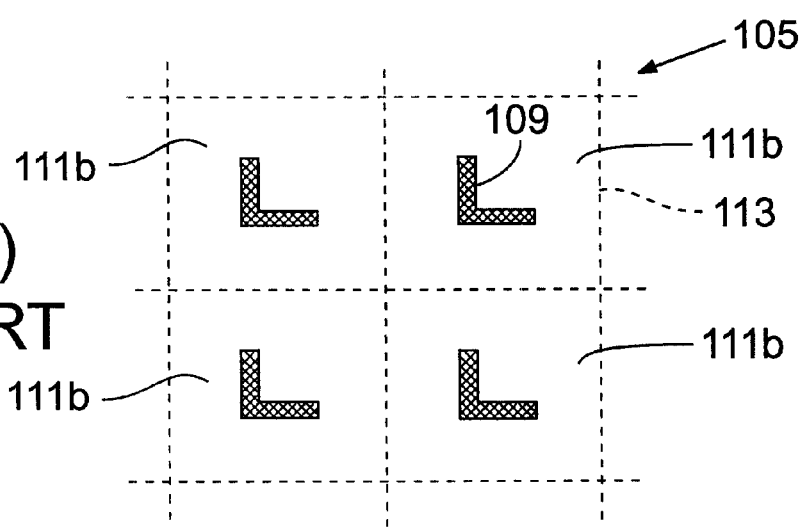

An example of a reticle used to perform divided-pattern projection-transfer according to the invention using an electron beam is shown in FIG. 4. Strong contrast is imparted to the image as formed on the wafer by providing on the reticle 10 corresponding regions defined by an electron-scattering material exhibiting a large scattering angle, and other regions defined by an electron-scattering material exhibiting a relatively small scattering angle. Thus, only electrons having a small scattering angle are allowed to pass through the contrast aperture 17 to form an image on the wafer 15. (The contrast aperture 17 in FIG. 3 is disposed at the pupil plane of the projection-optical system.) The reticle of FIG. 4 can be of either of two main types. The first type, termed a "scattering-membrane" reticle, comprises a thin silicon membrane (e.g., approximately 0.1 μm thick), upon which regions of a scattering material (e.g., heavy metal) are deposited to define pattern features. A second type, termed a "scattering-stencil" reticle, comprises a relatively thick (e.g., approximately 2 μm thick) silicon membrane that defines voids through holes corresponding to pattern features. In the scattering-membrane reticle, the silicon membrane is a low-scattering-angle electron-scattering material, whereas, in the scattering-stencil reticle, the silicon membrane is a high-scattering-angle electron-scattering material.

In FIG. 4, regions denoted by the squares 41 correspond to single exposure units (subfields) each measuring approximately (0.5 mm)$^2$ to (5 mm)$^2$ at the reticle. The peripheral area 43 surrounding each exposure unit 41 is termed a "skirt." The skirt 43 is made from a scattering material exhibiting a relatively high scattering angle so as to trim the patterned beam PB propagating downstream of the respective exposure unit 41. The width of each skirt 43 is approximately 10 to 100 μm. A strut member 45 extends perpendicularly (in the Z-direction) from each skirt 43. The struts 45 are collectively termed "grillage." Each strut 45 extends approximately 0.5 to 1 mm in the Z-direction and approximately 100 μm in the X- or Y-direction; thus, the grillage provides the reticle with substantial rigidity and mechanical strength.

In FIG. 4, four exposure units 41 form a single linear group arrayed in a respective row in the X-direction on the reticle 10. (Actual reticles typically have more than four exposure units 41 per row. The number of exposure units in each such row is defined by the maximal sweep angle of the illumination beam IB in the X-direction that can be achieved within the field of the illumination-optical and projection-optical systems.) Multiple such rows are arrayed in the Y-direction to form a "stripe" 49. The reticle 10 typically comprises multiple stripes 49 arrayed in the X-direction. Wide struts 47 extend in the Y-direction between adjacent stripes 49. The wide struts 47 provide additional rigidity to the reticle to further reduce flexing of the reticle. The wide struts 47 are typically several mm wide in the X-direction. The width of each stripe 49 corresponds to the maximal deflection of the illumination beam IB that can be achieved within the field of the illumination-optical and projection-optical systems.

During projection-transfer exposure, the features defined in the various exposure units are stitched together on the wafer 15 without projection of the non-patterned areas such as the skirts 43 and grillage. With a typical demagnification ratio of 1/4 or 1/5, if a single chip (e.g., for a 4-gigabit DRAM) on the wafer measures 27 mm×44 mm, then the corresponding pattern defined on the reticle including the non-patterned regions is approximately (120 mm to 150 mm)×(230 mm to 350 mm). As noted above, exposure units in a row in a stripe are sequentially exposed by sweeping the illumination beam. Movement as required from one row to the next and from one stripe to the next is achieved by appropriate movements of the reticle stage 11 and wafer stage 16 in a synchronous and coordinated manner.

Figure 1A:
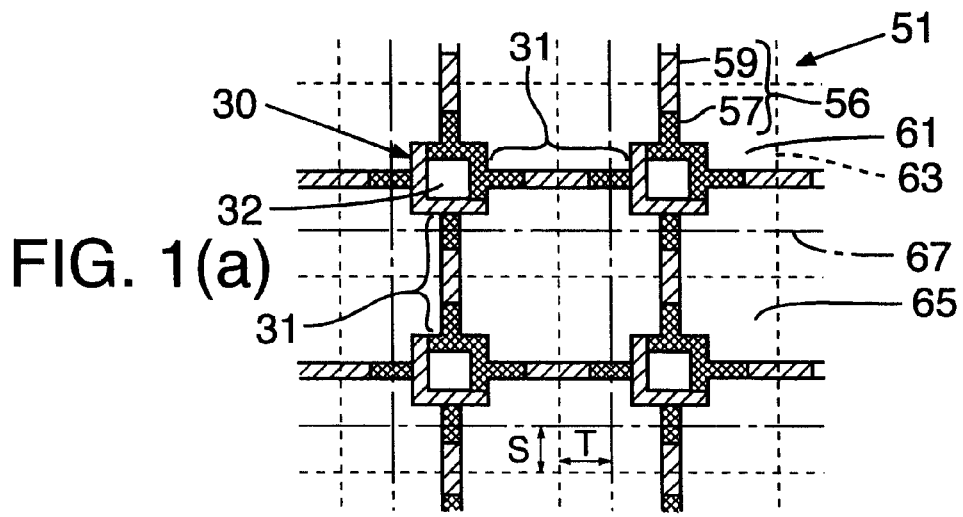
FIG. 1(*a*) is a plan view of a portion of a pattern, containing multiple island regions, to be transferred to a wafer according to a representative embodiment of the invention. Representative boundaries between adjacent exposure units are shown.
Figure 1B:
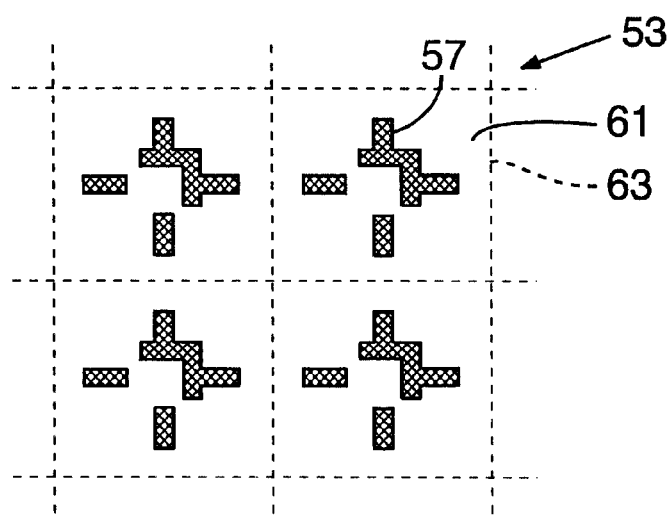
Figure 1C:
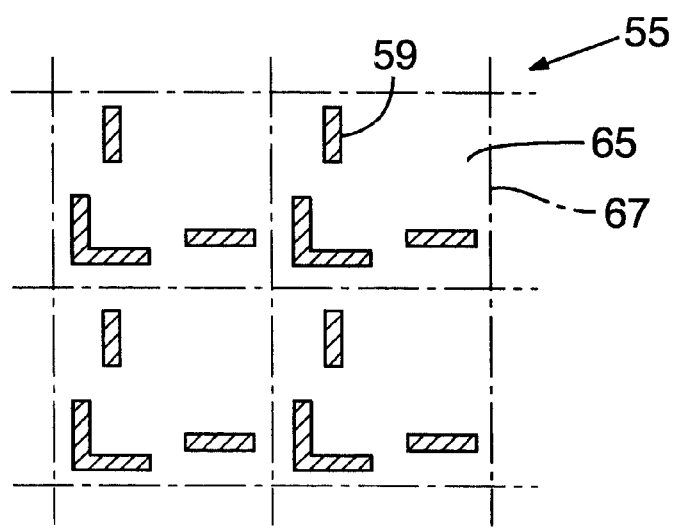
Figure 2A:
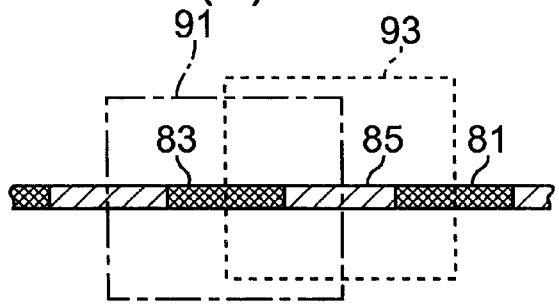
FIGS. 2(*a*)–2(*c*) are schematic plan views showing a representative division of a straight-line feature among complementary reticles (or reticle portions) according to the invention.
Figure 2D:
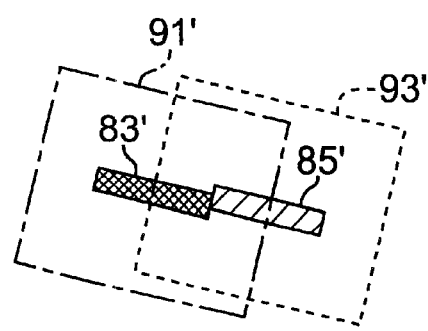
Figure 2B:
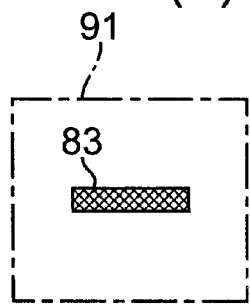
Figure 2E:
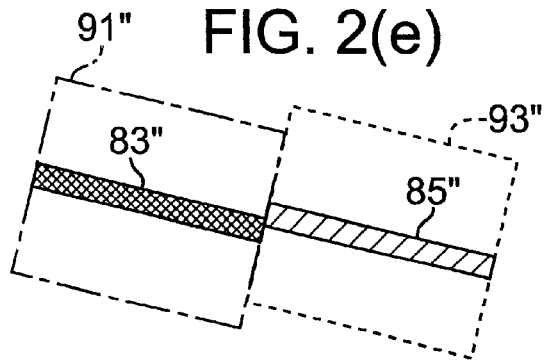
Figure 2C:
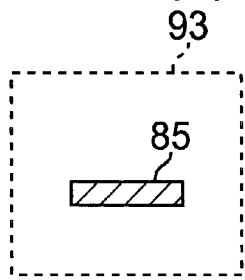

Pattern division, displacement, and exposure according to a representative embodiment of a method according to the invention are now described with reference to FIGS. 1(a)–1(c). FIG. 1(a) depicts, in plan view, a pattern portion consisting of four spaced-apart square features 30 with interconnecting lines 31. Inside each square feature 30 is an island region 32 that is defined on the reticle with a corresponding "black" region. The squares 30 and lines 31 are defined on the reticle with corresponding "white" regions. On a stencil reticle, the "white" regions are voids (through-holes) in the reticle membrane, and the "black" regions are regions occupied by the reticle membrane. In FIG. 1(a), "white" regions 56 are denoted by hatching and shading and comprise first and second feature portions 57, 59, respectively.

If the FIG. 1(a) reticle 51 is a stencil reticle, complementary reticles are required to fully expose the portion shown in FIG. 1(a). This is because, as discussed above, the island portions 32 cannot be defined in a single exposure using a stencil reticle. Therefore, the FIG. 1(a) reticle is divided into a first reticle 53 shown in FIG. 1(b) and a second reticle 55 shown in FIG. 1(c). (It will be understood that the first and second reticles 53, 55 need not be on physically separate reticles, but rather can be different regions of the same reticle.)

The first reticle 53 defines the first feature portions 57, and the second reticle 55 defines the second feature portions 59. The portion of the first reticle 53 shown in FIG. 1(b) is divided into four exposure units 61. To simplify this discussion, boundaries indicated by the dashed lines 63 extend between the exposure units 61. Similarly, the portion of the second reticle 55 shown in FIG. 1(c) is divided into four exposure units 65, and boundaries indicated by the dashed lines 67 extend between the exposure units 65. According to the invention, as can be seen in FIGS. 1(b)–1(c), the boundaries between adjacent exposure units are situated so as not to cross features defined in the exposure units. As a result of such configurations, the boundaries between subfields in the first and second reticles would not be in register if the features defined by the reticles were in register with each other. In other words, the seams 63 between exposure units 61 in the first reticle 53 are displaced from the seams 67 between exposure units 65 in the second reticle 55. More specifically, as shown in FIG. 1(a) (depicting a superposition of the first and second reticles with proper registration of the respective feature portions 57, 59) the dashed lines 63 denote exposure-unit seams of the first reticle 53, and the dashed lines 67 denote exposure-unit seams of the second reticle 55. In FIG. 1(a), although the feature portions defined by the first and second reticles are shown in proper registration with each other, the seams 63, 67 are displaced from each other by the distance S (in a first dimension) and T (in a second dimension). There are similar displacements between the exposure units 61 of the first reticle 53 relative to the exposure units 65 of the second reticle 55.

The features 56 are divided (to form feature portions 57, 59) in a manner such that no feature portion 57, 59 crosses a seam 63, 67, respectively. For example, the feature portions 57 (denoted by shading in FIG. 1(b)) are situated in each exposure unit 61 such that they are surrounded by the dashed lines 63. Meanwhile, the feature portions 59 denoted by hatching in FIG. 1(c)) are situated in each exposure unit 65 such that they are surrounded by the dashed lines 67.

Hence, as a result of selectively dividing the exposure units from one another in each of the first and second reticles (or reticle portions) 30 53, 55, respectively, no feature portions cross over seams between adjacent exposure units 61, 65, respectively, on the respective reticle (or reticle portion) 53, 55, respectively.

The pattern shown in FIG. 1(a) is produced on the wafer by two exposures on a corresponding region on the wafer.

The first exposure is of the exposure units 61 of the first reticle (or reticle portion) 53 and the second exposure is of the exposure units 65 of the second reticle (or reticle portion) 55. After making an exposure using the first reticle (or reticle portion) 53, an exposure using the second reticle (or reticle portion) 55 is made after displacing the second reticle (or reticle portion) 55 according to the displacements S, T relative to the first reticle or reticle portion 53. In such a manner, the images of all the projected exposure units can be stitched together properly on the region of the wafer.

The displacements S, T can be achieved by appropriate movements of one or both the reticle stage and wafer stage, by appropriately shifting the image field, and/or by appropriately deflecting the patterned beam as projected onto the wafer. Because the feature portions 57, 59 do not cross seams between adjacent exposure units on the same reticle (or reticle portion), better linewidth control is achieved, especially in regions of the projected pattern where adjacent exposure units are stitched together.

The beneficial result of improved pattern-transfer accuracy achieved with the present invention can be illustrated in the simplified example shown in FIGS. 2(*a*)–2(*e*). FIGS. 2(*a*), 2(*b*), and 2(*c*) depict, in a manner similar to FIGS. 1(*a*)–1(*c*), respectively, an exemplary manner in which a linear feature 81 is divided into first feature portions 83 and second feature portions 85. The first feature portions 83 are defined in exposure units 91 of a first reticle (or reticle portion), as shown in FIG. 2(*b*), and the second feature portions 85 are defined in exposure units 93 of a second reticle (or reticle portion), as shown in FIG. 2(*c*). Referring to FIG. 2(*b*), the feature portion 83 is situated approximately in the center of the respective exposure unit 91. Similarly, in FIG. 2(*c*), the feature portion 85 is situated approximately in the center of the respective exposure unit 93. For convenience in this example, the lengths of each feature portion 83, 85 are equal.

Thus divided, the two reticles (or reticle portion)s are projection-transferred to the wafer. Two exposures are required for exposure of the pattern, one for each exposure unit on the first reticle (or reticle portion) and another for each respective exposure unit on the second reticle (or reticle portion). Assume that a similar exposure-unit rotational error was present in the projected image of each exposure unit. Under such conditions, respective feature-portion images 83', 85' would be formed on the wafer at a slant, as shown in FIG. 2(*d*). However, because the feature-portion images 83', 85' exist in nearly the same respective locations in the respective exposure-unit images 91', 93', the rotational displacements of the feature-portion images 83', 85' due to the error is relatively small. For comparison, FIG. 2(*e*) shows a similar situation in which a division of the feature was not performed according to the invention. I.e., the feature portions 83" and 85" extend to the seams of the respective exposure units 91", 93". As a result, the error caused a relatively large rotational displacement of the feature portions 83" and 85" relative to each other.

Therefore, in exposure situations requiring the use of complementary reticles (or reticle portion)s to achieve projection-transfer of a pattern defined by a segmented reticle, by not forming feature portions on or near the seams of respective exposure units, much better linewidth accuracy can be achieved, especially at seams between adjacent exposure units as projected on the wafer.

Figure 6:
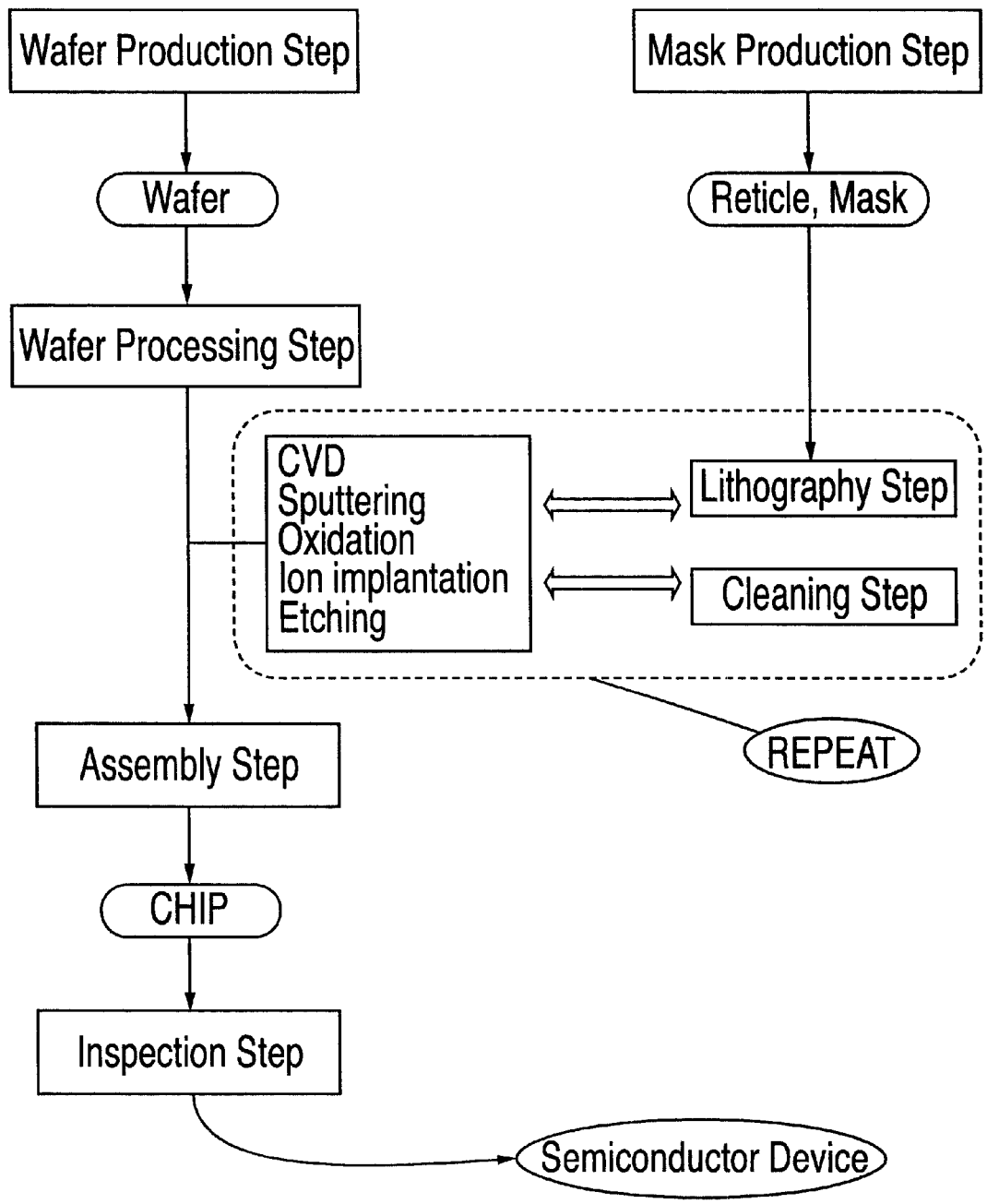
FIG. 6 is a process flowchart for manufacturing a semiconductor device, wherein the process includes a microlithography method according to the invention.

FIG. 6 is a flowchart of an exemplary semiconductor fabrication method to which apparatus and methods according to the invention can be readily applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 7:
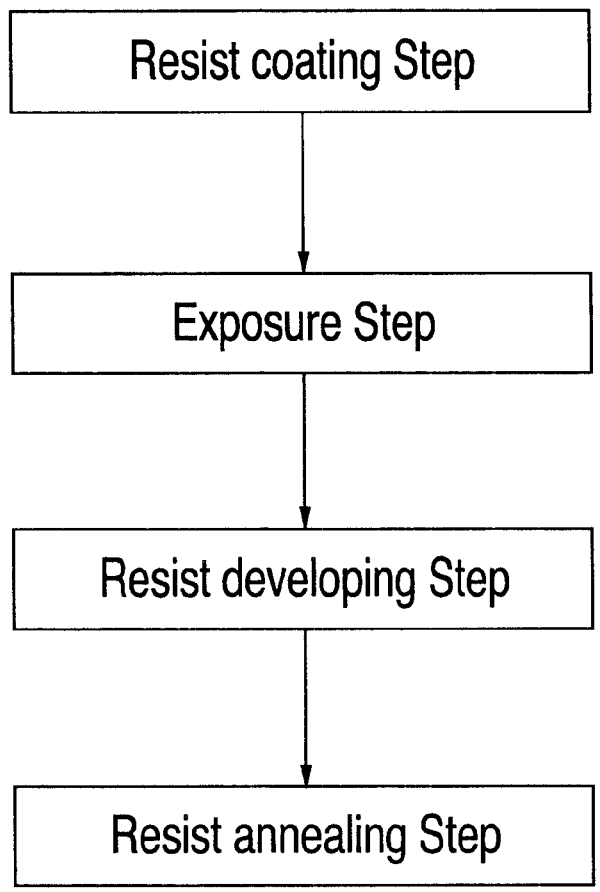
FIG. 7 is a process flowchart for performing a microlithography method that includes a projection-exposure method according to the invention.

FIG. 7 provides a flow chart of typical steps performed in microlithography, which is a principal step in wafer processing. The microlithography step typically includes: (1) resist-coating step, wherein a suitable resist is coated on the wafer substrate which can include a circuit element formed in a previous wafer-processing step; (2) exposure step, to expose the resist with the desired pattern; (3) development step, to develop the exposed resist; and (4) annealing step, to enhance the durability of the resist pattern.

Methods and apparatus according to the invention can be applied to a semiconductor fabrication process, as summarized above, to provide substantially accuracy and resolution.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. In a method for performing charged-particle-beam (CPB) projection-exposure including the steps of dividing a pattern, to be projection-exposed onto a sensitive substrate, into multiple exposure units each defining a respective portion of the pattern; sequentially illuminating the exposure units with a charged-particle (CP) illumination beam to form a respective CP patterned beam; and projecting the patterned beam onto a sensitive substrate to form images of the exposure units at respective locations on the substrate at which the images of the exposure units are stitched together to form an image of the pattern on the substrate, a method for projection-exposing an exposure unit requiring more than one exposure shot, comprising:

(a) with respect to any exposure unit defining a feature requiring two separate exposure shots to fully transfer the feature to the substrate, dividing each of such exposure units into first and second complementary exposure units each defining respective feature portions;

(b) defining boundaries around each first complementary exposure unit, and boundaries around each second complementary exposure unit, wherein the boundaries around the first complementary exposure units do not cross over the respective feature portions defined by the first complementary exposure units, and the boundaries around the second complementary exposure units do not cross over the respective feature portions defined by the second complementary exposure units, thereby causing the boundaries around the second complementary exposure units to be shifted relative to the boundaries around the first complementary exposure units; and (c) projection-exposing the first complementary exposure units and the second complementary exposure units onto respective locations on the substrate such that, when projection-exposing a second complementary exposure unit on an image of a respective first complementary exposure unit, the boundaries around the second complementary exposure unit are shifted relative to the boundaries around the respective first complementary exposure unit.

2. The method of claim 1, wherein, in step (b), the first and second complementary exposure units are defined on at least one stencil reticle.

3. A segmented reticle for use in charged-particle-beam microlithography, the reticle comprising:

(a) multiple exposure units each defining a respective portion of a pattern to be projection-exposed onto a sensitive substrate;

(b) at least one exposure unit defining a feature requiring two separate exposures to fully transfer the feature to the substrate, said exposure unit being divided into first and second complementary exposure units each defining respective feature portions;

(c) each first complementary exposure unit being surrounded by respective boundaries, and each second complementary exposure unit being surrounded by respective boundaries, wherein the boundaries around the first complementary exposure units do not cross over the respective feature portions defined by the first complementary exposure units, and the boundaries around the second complementary exposure units do not cross over the respective feature portions defined by the second complementary exposure units, thereby causing the boundaries around the second complementary exposure units to be shifted relative to the boundaries around the first complementary exposure units whenever the feature portions defined by the second complementary exposure unit are placed in registration with the feature portions defined by the respective first complementary exposure units.

4. The reticle of claim 3, configured as a stencil reticle.

5. A charged-particle-beam microlithographic projection-exposure apparatus, comprising:

(a) a substrate stage on which a sensitive substrate is mounted for CPB projection-exposure of the substrate;

(b) a reticle according to claim 3;

(c) a reticle stage on which the reticle is mounted;

(d) an illumination-optical system situated upstream of the reticle stage, the illumination-optical system being configured to sequentially illuminate the exposure units of the reticle with a CP illumination beam; and (e) a projection-optical system situated between the reticle stage and the substrate stage, the projection-optical system being configured to project, via a patterned beam propagating downstream of the reticle on the reticle stage, an image of the illuminated exposure unit onto a corresponding location on the sensitive substrate so as to stitch together the exposure-unit images and form an image of the pattern on the substrate.

6. The apparatus of claim 5, wherein the reticle is a stencil reticle.

7. The apparatus of claim 5, wherein the reticle comprises a first reticle portion defining the first complementary exposure units and a second reticle portion defining the second complementary exposure units.

8. The apparatus of claim 7, wherein the first and second reticle portions are located on separate reticles.

9. A semiconductor-fabrication process, comprising the steps of:

(a) preparing a wafer;

(b) processing the wafer; and (c) assembling devices formed on the wafer during steps a and (b), wherein step (b) comprises a method for performing projection microlithography as recited in claim 1.

10. A semiconductor-fabrication process, comprising the steps of:

(a) preparing a wafer;

(b) processing the wafer; and (c) assembling devices formed on the wafer during steps a and (b), wherein step (b) comprises the steps of (i) applying a resist to the wafer; (ii) exposing the resist; developing the resist; and (iv) annealing the resist; and step (ii) comprises providing a charged-particle-beam projection-exposure apparatus as recited in claim 5; and using the charged-particle-beam projection-exposure apparatus to expose the resist with the pattern defined on the reticle.

11. A semiconductor device produced by the method of claim 10.

* * * * *

UNITED STATES PATENT AND TRADEMARK OFFICE
CERTIFICATE OF CORRECTION

PATENT NO. : 6,573,515 B1
DATED : June 3, 2003
INVENTOR(S) : Suzuki

It is certified that error appears in the above-identified patent and that said Letters Patent is hereby corrected as shown below:

Column 2,
Line 1, "tan" should be -- than --.

Column 10,
Line 62, "30 53, 55" should be -- 53, 55 --.

Column 11,
Lines 38 and 59, "portion)s" should be -- portions) --.

Column 12,
Line 36, "substantially" should be -- substantial --.

Signed and Sealed this

Thirtieth Day of December, 2003

JAMES E. ROGAN
*Director of the United States Patent and Trademark Office*